United States Patent
Ma

(10) Patent No.: US 11,908,928 B2
(45) Date of Patent: Feb. 20, 2024

(54) FIELD PLATE ANCHORING STRUCTURE FOR TRENCH-BASED SEMICONDUCTOR DEVICES

(71) Applicant: Infineon Technologies Austria AG, Villach (AT)

(72) Inventor: Ling Ma, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 142 days.

(21) Appl. No.: 17/534,495

(22) Filed: Nov. 24, 2021

(65) Prior Publication Data

US 2023/0163210 A1 May 25, 2023

(51) Int. Cl.
*H01L 29/78* (2006.01)
*H01L 29/40* (2006.01)
*H01L 29/417* (2006.01)
*H01L 29/66* (2006.01)

(52) U.S. Cl.
CPC ........ *H01L 29/7813* (2013.01); *H01L 29/401* (2013.01); *H01L 29/407* (2013.01); *H01L 29/41741* (2013.01); *H01L 29/66734* (2013.01)

(58) Field of Classification Search
CPC . H01L 29/7813; H01L 29/401; H01L 29/407; H01L 29/41741; H01L 29/66734; H01L 29/0649; H01L 29/0696; H01L 29/404
See application file for complete search history.

(56) References Cited

U.S. PATENT DOCUMENTS

| 6,566,691 | B1 * | 5/2003 | Inoue | H01L 29/7397 257/E21.384 |
| 9,105,679 | B2 * | 8/2015 | Laven | H01L 29/7397 |
| 9,991,347 | B2 | 6/2018 | Haase et al. | |
| 10,355,126 | B2 | 7/2019 | Blank | |
| 2001/0035561 | A1 | 11/2001 | Hirler et al. | |
| 2009/0140327 | A1 * | 6/2009 | Hirao | H01L 29/7802 438/270 |

(Continued)

FOREIGN PATENT DOCUMENTS

| DE | 10014660 A1 | 10/2001 |
| DE | 102013103099 A1 | 9/2013 |
| DE | 102013108614 A1 | 2/2014 |

*Primary Examiner* — Shahed Ahmed
*Assistant Examiner* — Khatib A Rahman
(74) *Attorney, Agent, or Firm* — Murphy, Bilak & Homiller, PLLC

(57) ABSTRACT

A semiconductor device includes: a semiconductor substrate; a first gate trench and a second gate trench both extending from a first main surface of the semiconductor substrate into the semiconductor substrate; a semiconductor mesa delimited by the first and second gate trenches; and a field plate trench extending from the first main surface through the semiconductor mesa. The field plate trench includes a field plate separated from each sidewall and a bottom of the field plate trench by an air gap. The field plate is anchored to the semiconductor substrate at the bottom of the field plate trench by an electrically insulative material that occupies a space in a central part of the field plate, the electrically insulative material spanning the air gap to contact the semiconductor substrate at the bottom of the field plate trench. Methods of producing the semiconductor device are also described.

20 Claims, 13 Drawing Sheets

(56) References Cited

U.S. PATENT DOCUMENTS

| | | |
|---|---|---|
| 2012/0261746 A1 | 10/2012 | Darwish et al. |
| 2013/0134505 A1 | 5/2013 | Kobayashi |
| 2015/0221756 A1* | 8/2015 | Vellei .................. H01L 29/7813 |
| | | 257/139 |
| 2016/0149028 A1 | 5/2016 | Jin et al. |
| 2016/0293751 A1* | 10/2016 | Siemieniec ......... H01L 29/8613 |
| 2017/0005171 A1* | 1/2017 | Laforet ............... H01L 29/7813 |
| 2017/0263767 A1* | 9/2017 | Nishiwaki ......... H01L 29/66734 |
| 2017/0365708 A1* | 12/2017 | Li ....................... H01L 29/1095 |

* cited by examiner

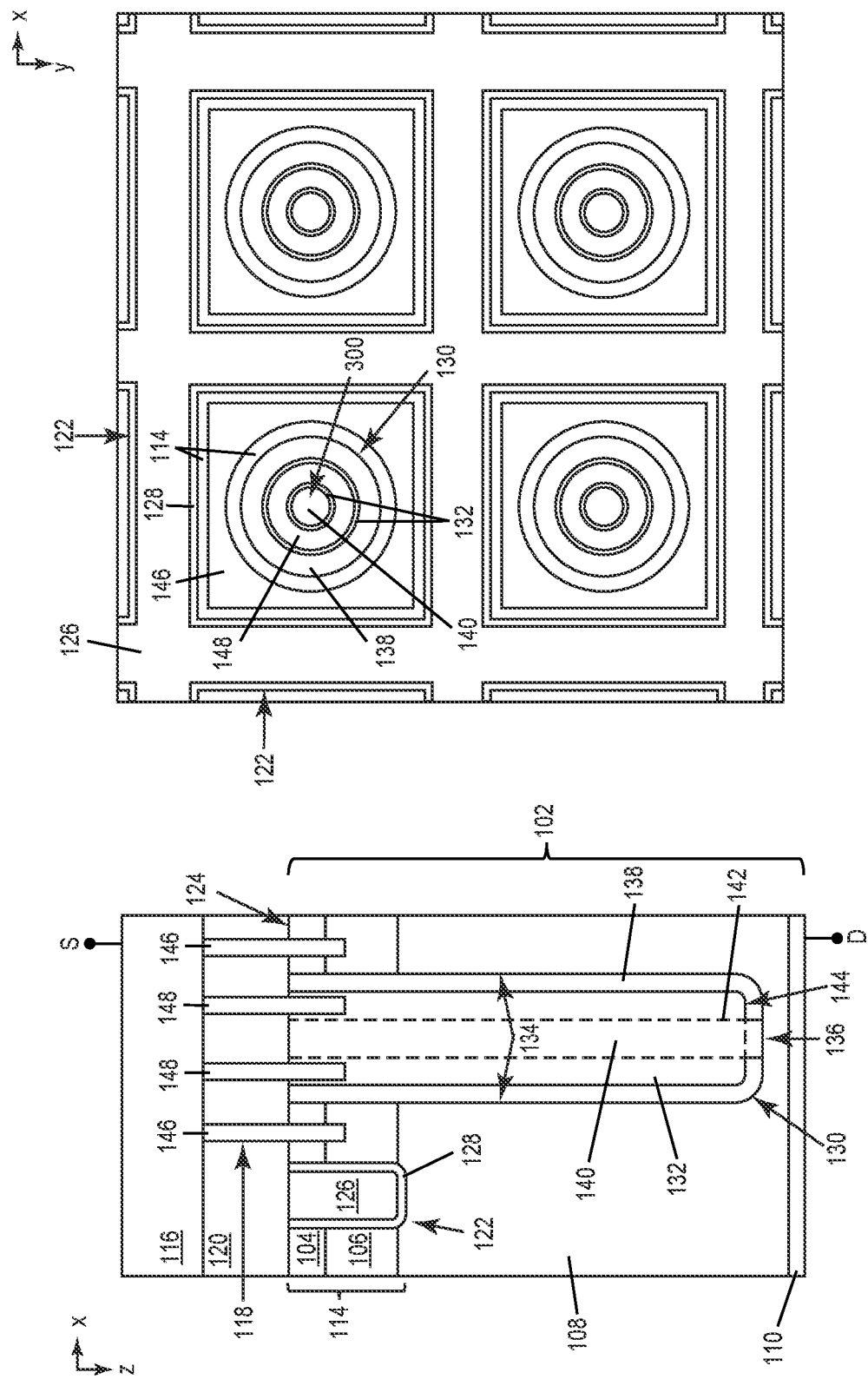

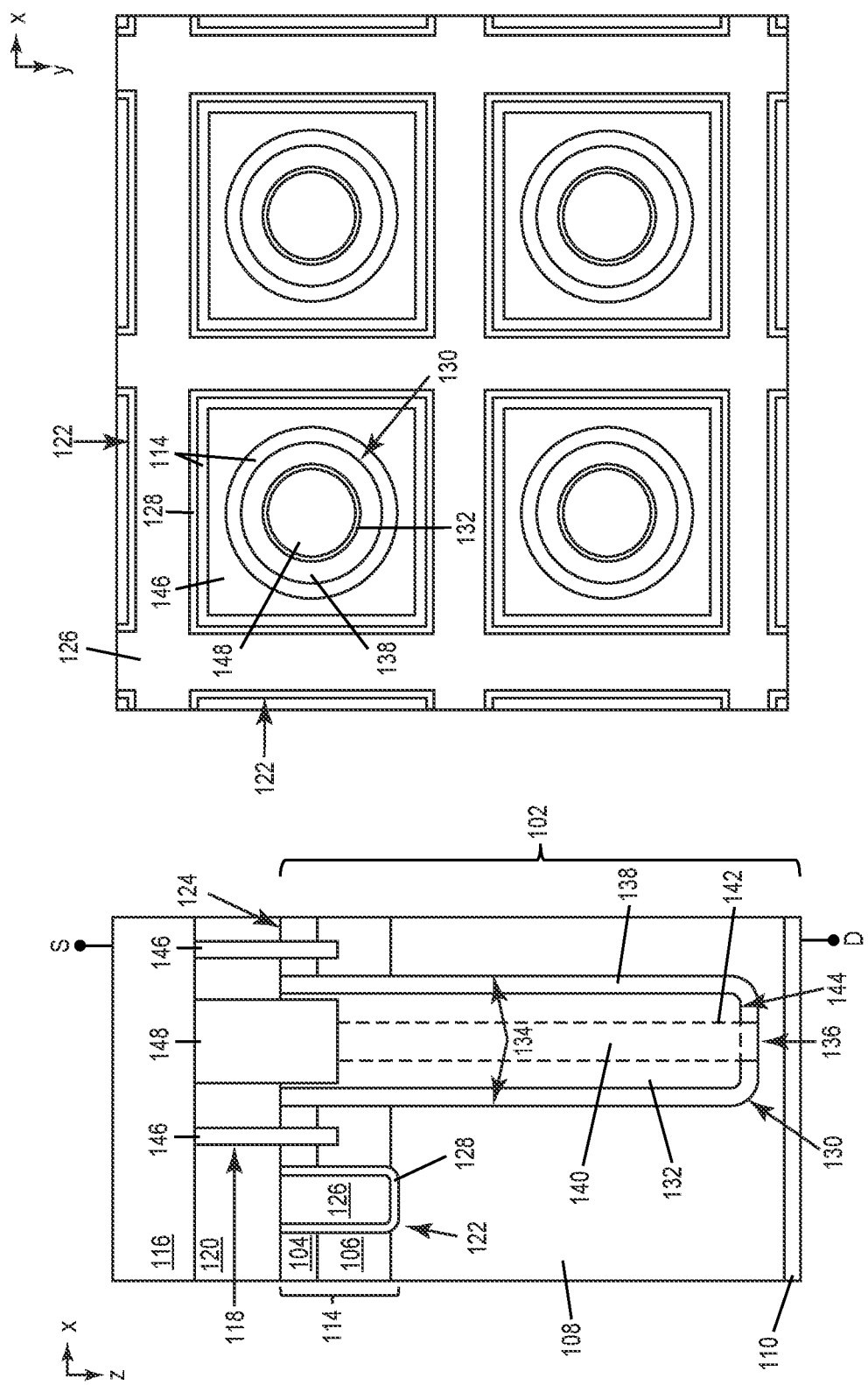

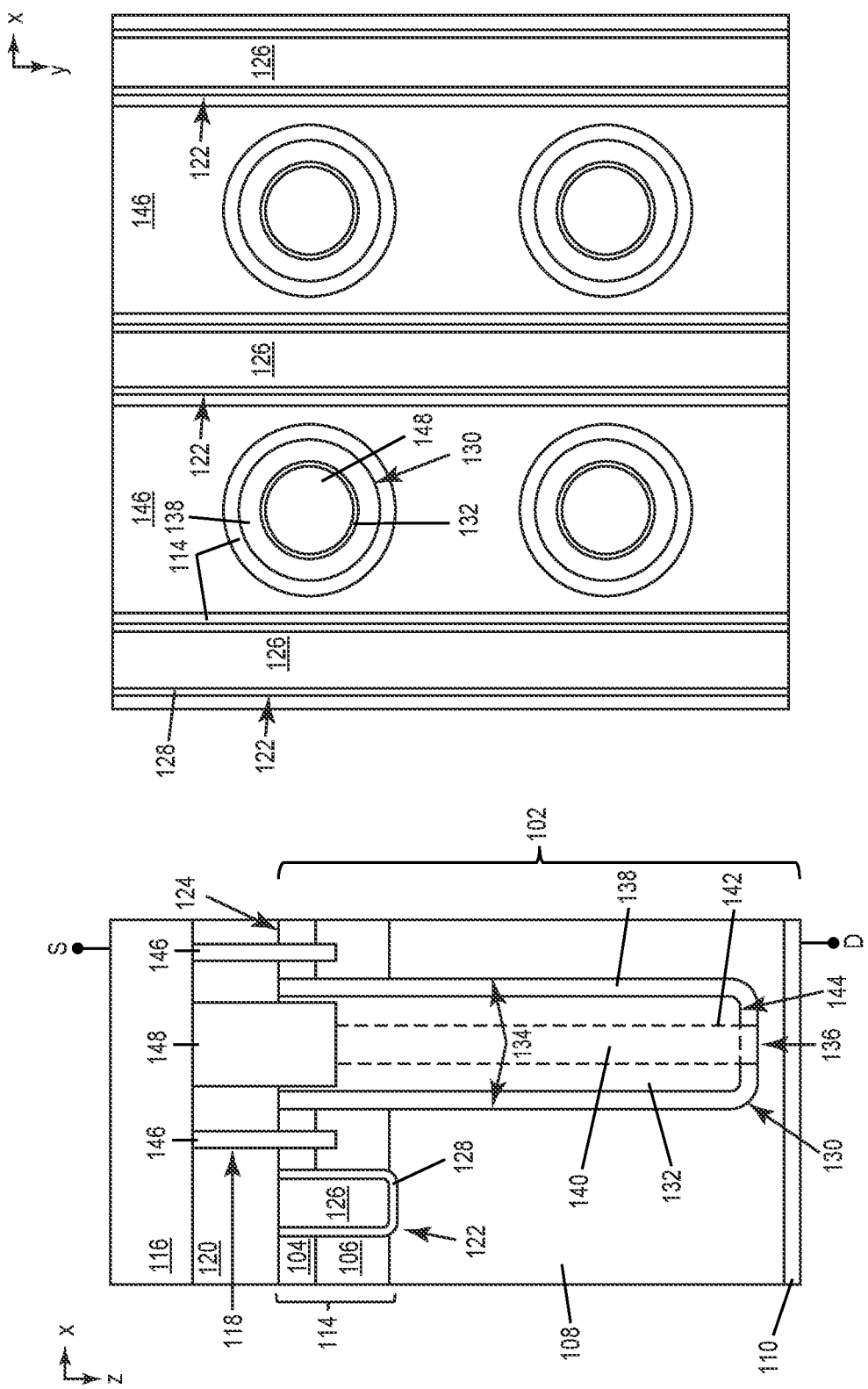

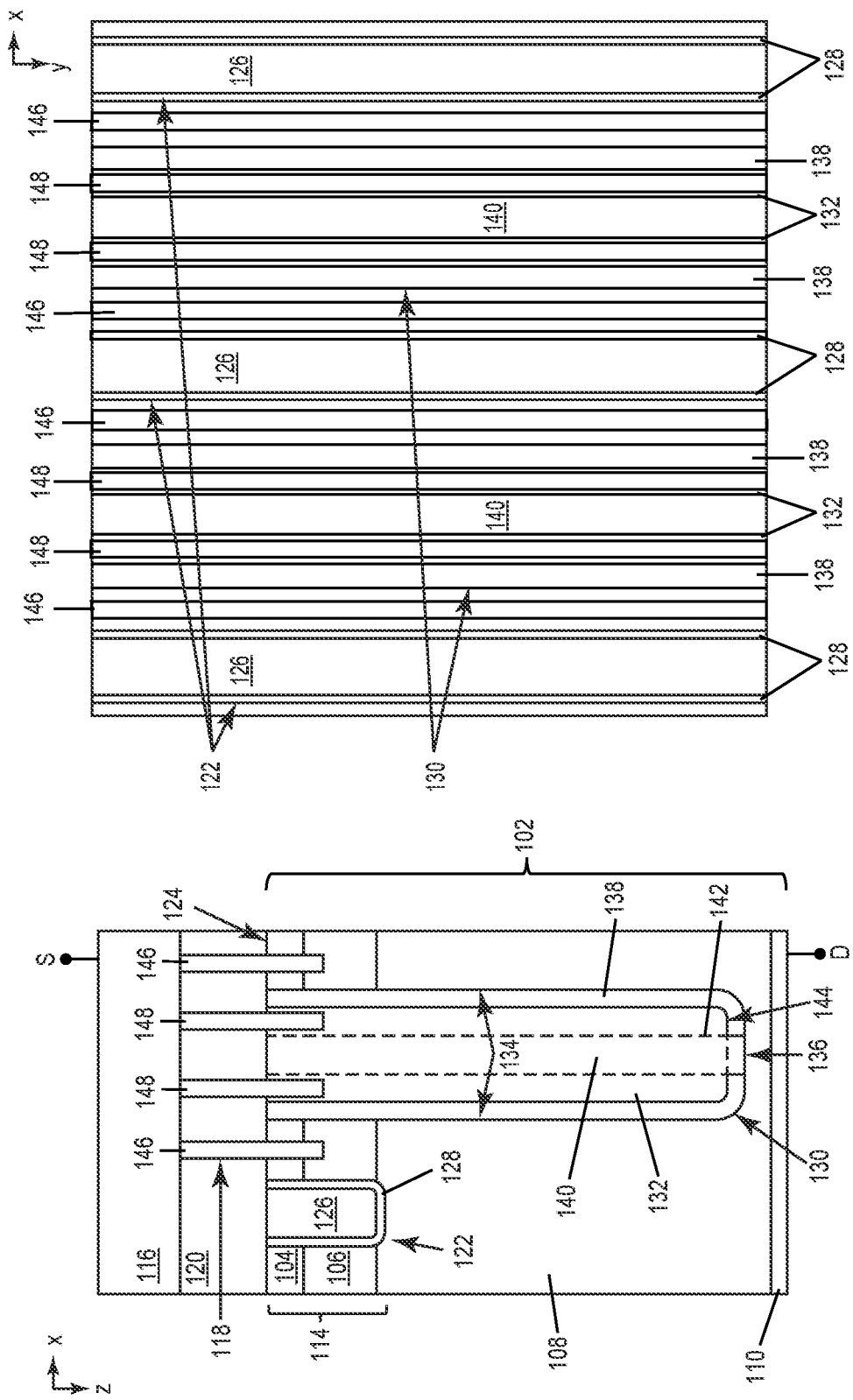

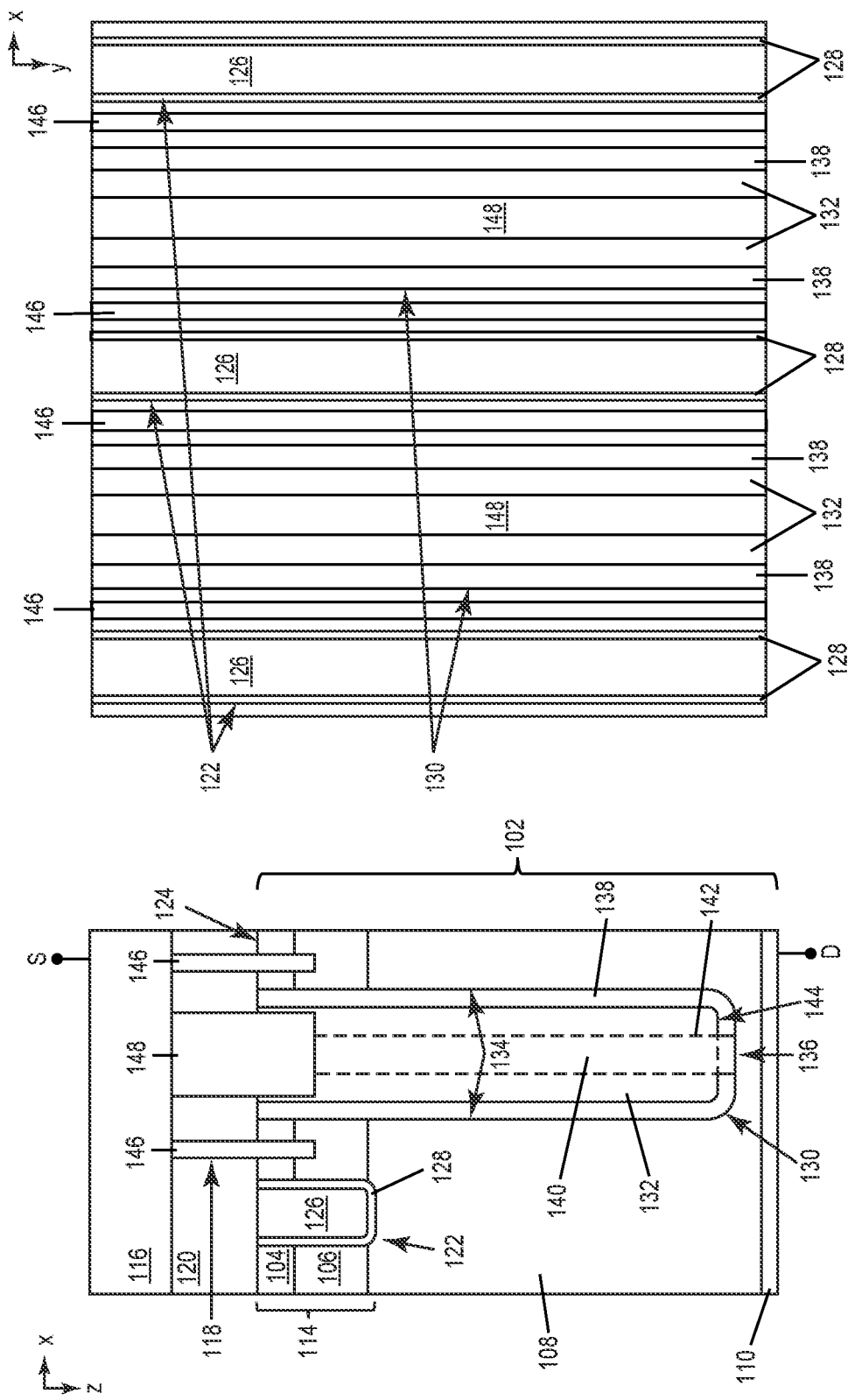

FIELD PLATE ANCHORING STRUCTURE FOR TRENCH-BASED SEMICONDUCTOR DEVICES

BACKGROUND

Power MOSFETs (metal-oxide-semiconductor field-effect transistors) are widely used in high power applications such as, e.g., power converters and inverters. Power MOSFET performance can be improved by incorporating field plates in the same or different trenches as the gate electrodes, where the field-plate effect yields a higher breakdown voltage with relatively low drift layer resistance. Further performance gains can be realized by improving upon the field plate design and configuration.

Thus, there is a need for an improved field plate structure for power transistor devices.

SUMMARY

According to an embodiment of a semiconductor device, the semiconductor device comprises: a semiconductor substrate; a first gate trench and a second gate trench both extending from a first main surface of the semiconductor substrate into the semiconductor substrate; a semiconductor mesa delimited by the first and second gate trenches; and a field plate trench extending from the first main surface through the semiconductor mesa, wherein the field plate trench comprises a field plate separated from each sidewall and a bottom of the field plate trench by an air gap, wherein the field plate is anchored to the semiconductor substrate at the bottom of the field plate trench by an electrically insulative material that occupies a space in a central part of the field plate, the electrically insulative material spanning the air gap to contact the semiconductor substrate at the bottom of the field plate trench.

According to another embodiment of a semiconductor device, the semiconductor device comprises: a semiconductor substrate; a gate trench extending from a first main surface of the semiconductor substrate into the semiconductor substrate; a field plate trench extending from the first main surface into the semiconductor substrate and laterally spaced apart from the gate trench, the field plate trench having one or more sidewalls and a bottom; a field plate in the field plate trench; an air gap separating the field plate from the one or more sidewalls and the bottom of the field plate trench; a space in a central part of the field plate; and an electrically insulative material occupying the space in the central part of the field plate and anchoring the field plate to the semiconductor substrate by spanning the air gap at the bottom of the field plate trench.

According to an embodiment of a method of producing a semiconductor device, the method comprises: etching a first gate trench and a second gate trench into a first main surface of a semiconductor substrate, the first and second gate trenches delimiting a semiconductor mesa; etching a field plate trench into the first main surface, the field plate trench extending through the semiconductor mesa; forming a field plate in the field plate trench, the field plate being separated from each sidewall and a bottom of the field plate trench by an air gap, the field plate having a space in a central part of the field plate; and anchoring the field plate to the semiconductor substrate at the bottom of the field plate trench by an electrically insulative material that occupies the space in the central part of the field plate, the electrically insulative material spanning the air gap to contact the semiconductor substrate at the bottom of the field plate trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A through 8B illustrate additional semiconductor device embodiments that include a field plate anchoring structure, where FIGS. 3A, 4A, 5A, 6A, 7A, and 8A are cross-sectional views in the region of one transistor cell and FIGS. 3B, 4B, 5B, 6B, 7B, and 8B are corresponding top plan views in the region of two or more adjacent transistor cells TC.

DETAILED DESCRIPTION

The embodiments described herein provide a field plate anchoring structure for trench-based power semiconductor devices. The power semiconductor device includes field plate trenches each having a field plate separated from the surrounding semiconductor substrate by an air gap which may be at a partial vacuum. The field plates are anchored to the semiconductor substrate at the bottom of each field plate trench by an electrically insulative material that occupies a space in a central part of the field plate. The electrically insulative material spans the air gap that separates each field plate from the surrounding semiconductor substrate, to contact the semiconductor substrate at the bottom of the field plate trenches.

Described next with reference to the figures are embodiments of the field plate anchoring structure and methods of producing the field plate anchoring structure.

Figure 1:
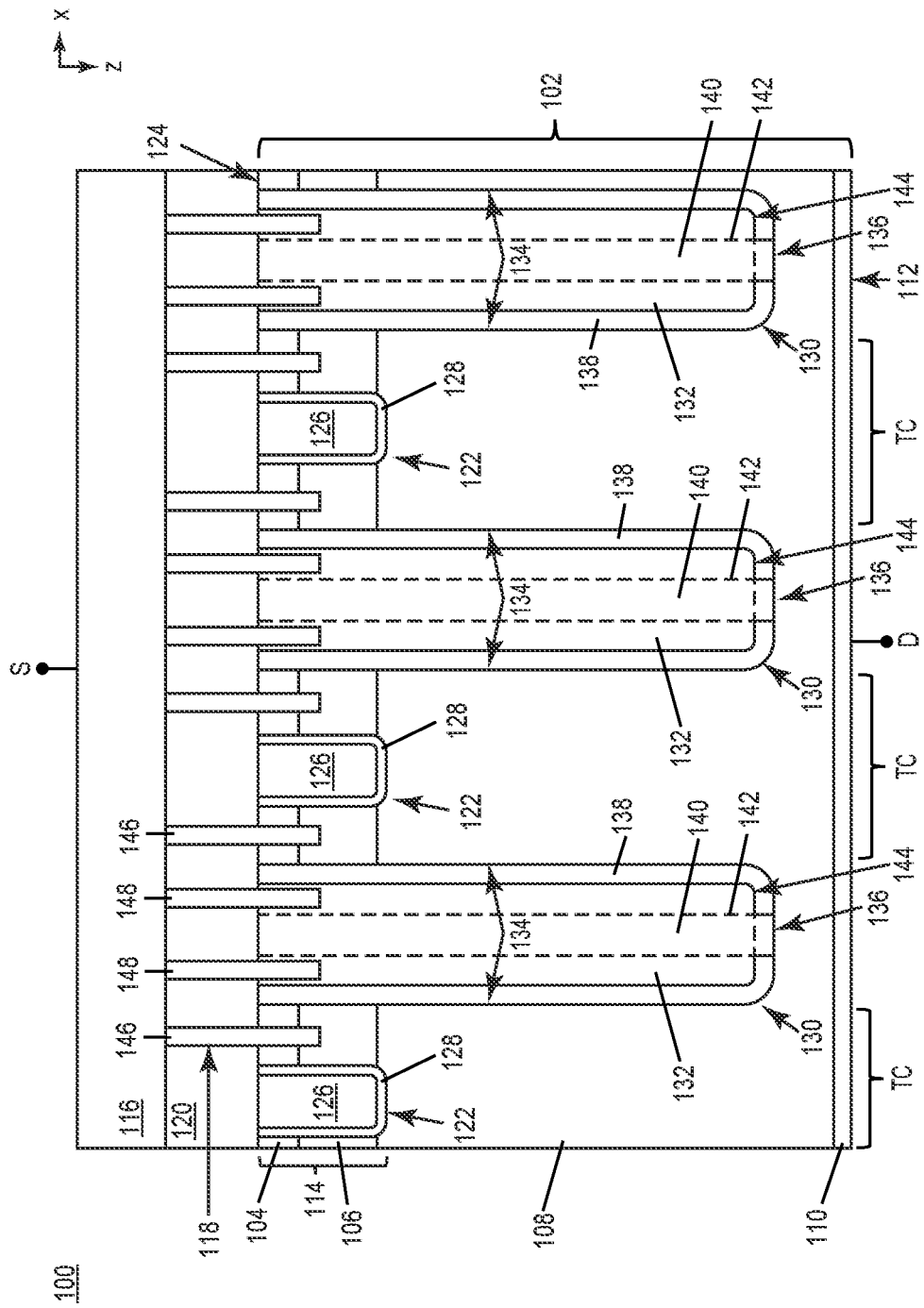
FIG. 1 illustrates a partial cross-sectional view of an embodiment of a semiconductor device that includes a field plate anchoring structure.

FIG. 1 illustrates a partial cross-sectional view of an embodiment of a semiconductor device 100 that includes the field plate anchoring structure. The semiconductor device 100 may be a low voltage power MOSFET having a maximum rated voltage of 60V or below. The semiconductor device 100 instead may be a medium voltage power MOSFET having a maximum rated voltage between 60V and 300V, or a high voltage power MOSFET having a maximum rated voltage greater than 300V. Other device types may utilize the field plate anchoring teachings described herein.

In each case, the semiconductor device 100 includes a semiconductor substrate 102. The semiconductor substrate 102 comprises one or more semiconductor materials that are used to form power semiconductor devices such as, e.g., Si or SiC power MOSFETs. For example, the semiconductor substrate 102 may comprise Si, silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material.

In the case of a power transistor device, transistor cells 'TC' formed in the semiconductor substrate 102 and electrically coupled in parallel to form a power transistor such as, e.g., a Si or SiC power MOSFET. Three (3) adjacent transistor cells TC are shown in the partial cross-sectional view of FIG. 1. In general, the semiconductor device may have tens, hundreds, thousands, or even more transistors cells TC.

Each transistor cell TC includes a source region 104 of a first conductivity type and a body region 106 of a second conductivity type opposite the first conductivity type. The source region 104 of each transistor cell TC is separated from a drift zone 108 of the first conductivity type by the corresponding body region 106. In the case of a Si or SiC power MOSFET, a drain region 110 adjoins the drift zone 108 at the back surface 112 of the semiconductor substrate 102.

The first conductivity is n-type and the second conductivity type is p-type for an n-channel device whereas the first conductivity is p-type and the second conductivity type is n-type for a p-channel device. For either n-channel or p-channel devices, the source region 104 and the body region 106 included in the same semiconductor mesa 114 form part of a transistor cell TC and the transistor cells TC are electrically connected in parallel between source (S) and drain (D) terminals of the semiconductor device 100 to form a power transistor.

The body regions 106 may include a body contact region (not shown) of the second conductivity type and having a higher doping concentration than the body regions 106, to provide an ohmic connection with a source metallization 116 through a contact structure 118 that extends through an interlayer dielectric 120 that separates the source metallization 116 from the underlying semiconductor substrate 102. The source regions 104 are also electrically connected to the source metallization 116 through the contact structure 118. The field plates 132 also may be electrically connected to the source metallization 116 through the contact structure 118, or to a different potential. Not all field plates 132 need be at the same potential. Some or all field plates 132 may be electrically floating, i.e., not connected to a defined potential.

Stripe-shaped gate trenches 122 extend from a front surface 124 of the semiconductor substrate 102 and into the substrate 102. The gate trenches 122 are 'stripe-shaped' in that the gate trenches 122 have a longest linear dimension in a direction which runs in and out of the page in FIG. 1 and parallel to the front surface 124 of the semiconductor substrate 102 and transverses the depth-wise direction (z direction in FIG. 1) of the semiconductor substrate 102. The gate trenches 122 delimit the semiconductor mesas 114.

Each gate trench 122 includes a gate electrode 126 and a gate dielectric insulating material 128 that separates the gate electrode 126 from the surrounding semiconductor substrate 102. The gate electrodes 126 are electrically connected to a gate terminal of the device 100 through, e.g., metal gate runners and respective contacts/vias that extend through the interlayer dielectric 120 and which are out of view in FIG. 1.

Field plate trenches 130 extend from the front surface 124 through the semiconductor mesas 114 delimited by the gate trenches 122 and are laterally spaced apart from the gate trenches 122. The field plate trenches 130 may be stripe-shaped or 'needle-shaped'. 'Needle-shaped' trenches are trenches that are narrow and long in a depth-wise direction (z direction in FIG. 1) of the semiconductor substrate 102 and may resemble a needle, column or spicule in the depth-wise direction of the semiconductor substrate 102. The field plate trenches 130 help optimize the area-specific on-state resistance achievable for a given breakdown voltage, by providing charge carrier compensation.

Each field plate trench 130 includes a field plate 132 separated from each sidewall 134 and a bottom 136 of the field plate trench 130 by an air gap 138. Accordingly, the field plate 132 disposed in each field plate trench 130 is separated from the surrounding semiconductor substrate 102 by the air gap 138 instead of a standard field dielectric insulating material such as SiOx. Utilizing the air gaps 138 instead of a standard field dielectric insulating material improved device performance by allowing for a higher breakdown voltage with relatively low drift layer resistance. The air gaps 138 that separate the field plates 132 from the surrounding semiconductor substrate 102 may be at a partial vacuum. For example, the air gaps 138 may be at a low vacuum that is slightly below atmospheric pressure. The air gaps 138 may be filled with an inert gas such as nitrogen, for example.

The field plates 132 and the gate electrodes 126 may be made from any suitable electrically conductive material such as but not limited to polysilicon, metal (e.g., tungsten), metal alloy, etc. The field plates 132 and the gate electrodes 126 may comprise the same or different electrically conductive material. The gate dielectric insulating material 128 may comprise, e.g., SiOx and may be formed by thermal oxidation and/or deposition, for example.

Regardless of the type of power transistor implemented by the transistor cells TC, and according to the embodiment illustrated in FIG. 1, each field plate 132 is anchored to the semiconductor substrate 102 at the bottom 136 of the respective field plate trenches 130 by an electrically insulative material 140 that occupies a space in a central part 142 of the field plate 132. According to this embodiment, the central part 142 of the field plate 132 is hollow and the hollow space is filled with the electrically insulative anchoring material 140. The hollow space extends to the bottom 144 of the field plates 132 such that the bottom 144 of the field plates 132 is open in the central part 142, allowing the electrically insulative anchoring material 140 to span the air gap 138 and contact the semiconductor substrate 102 at the bottom 136 of the field plate trenches 130.

During operation of the semiconductor device 100, the highest electric fields occur in the semiconductor substrate 102 near the bottom 136 of the field plate trenches 130 but not directly under the trenches 130. Anchoring the field plates 132 to the semiconductor substrate 102 along the central part 142 of the field plates 132 ensures that the electrically insulative anchoring material 140 has a minimal impact on the blocking capability. In one embodiment, the field plates 132 comprise polysilicon and the electrically insulative anchoring material comprises nitride.

The field plate anchoring structure illustrated in FIG. 1 anchors the field plates 132 at the bottom 136 of the field plate trenches 130, thereby preventing movement of the air-gap isolated field plates 132 which in turn stabilizes the nearby electric fields in the semiconductor substrate 102. If the air-gap isolated field plates 132 were instead anchored at the top of the field plate trenches 130, the field plates 132 would dangle in the lower part of the field plate trenches 130 and therefore be prone to move which would cause changes in the nearby electric fields in the semiconductor substrate 102.

The interlayer dielectric 120 formed on the front surface 124 of the semiconductor substrate 102 seals the air gap 138 in the field plate trenches 130. The contact structure 118 has a first part 146 in electrical and physical contact with the source and body regions 104, 106 formed in the respective semiconductor mesas 114, and a second part 148 in electrical and physical contact with the field plates 132. The second part 148 of the contact structure 118 is laterally spaced inward and separated from the first part 146 of the contact structure 118. The first part 146 of the contact structure 118 extends through the interlayer dielectric 120 to electrically connect the overlying metallization layer 116 to the source and drain regions 104, 106 formed in the respective semiconductor mesas 114. The second part 148 of the contact structure 118 extends through the interlayer dielectric 120 to electrically connect the overlying metallization layer 116 to the field plate 132 in some or all field plate trenches 130. In one embodiment, the space between the second part 148 of the contact structure 118 and the first part 146 of the contact structure 118 is aligned with the air gap 138 in the field plate trench 130 such that no part of the contact structure 118 covers the air gap 138, e.g., as shown in FIG. 1.

FIGS. 2A through 2K illustrate cross-sectional views of an embodiment of a method of producing the semiconductor device 100 with the field plate anchoring structure illustrated in FIG. 1, in the region of one transistor cell TC.

Figure 2B:
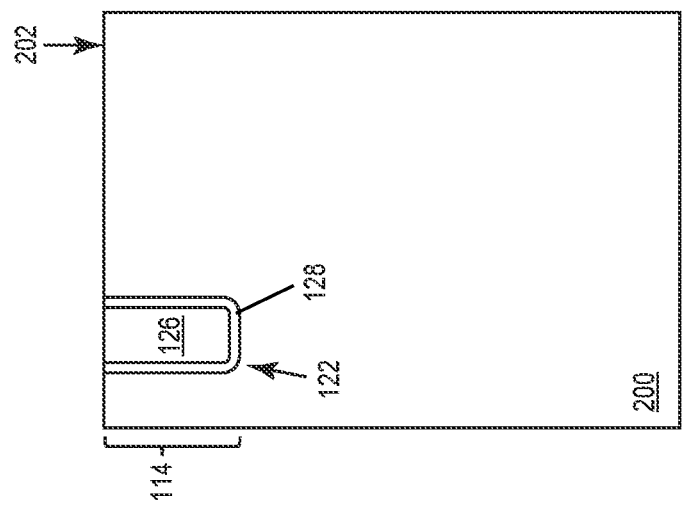
FIGS. 2A through 2K illustrate cross-sectional views of an embodiment of a method of producing a semiconductor device with a field plate anchoring structure, in the region of one transistor cell.
Figure 2A:

FIG. 2A shows a semiconductor wafer 200. The semiconductor wafer 200 comprises one or more semiconductor materials that are used to form power semiconductor devices such as, e.g., Si or SiC power MOSFETs. For example, the semiconductor wafer 200 may comprise Si, SiC, Ge, SiGe, GaN, GaAs, and the like. The semiconductor wafer 200 may be a bulk semiconductor material or may include one or more epitaxial layers grown on a bulk semiconductor material.

FIG. 2B shows the semiconductor wafer 200 after etching a gate trench 122 into a first main surface 202 of the semiconductor wafer 200 and arranging a gate electrode 126 and a gate dielectric insulating material 128 in the gate trench 122, with the gate dielectric insulating material 128 separating the gate electrode 126 from the surrounding semiconductor material. The gate trench 122 is stripe-shaped and adjacent gate trenches 122 delimit a semiconductor mesa 114.

Figure 2D:
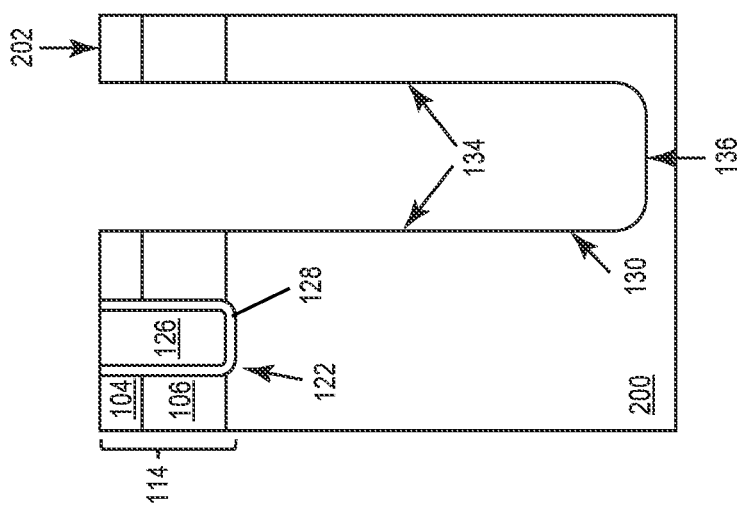
Figure 2C:
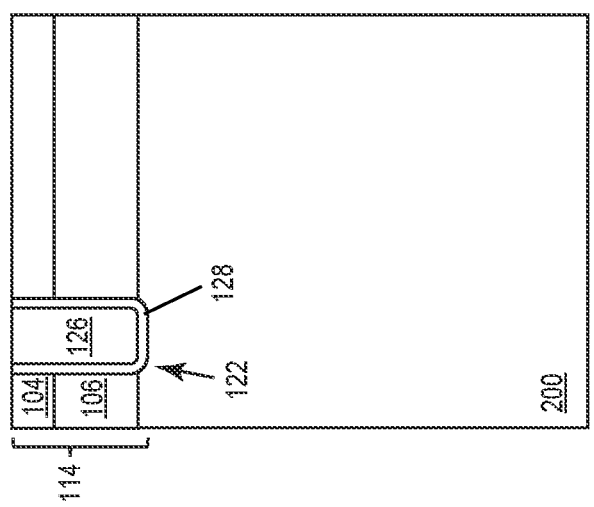

FIG. 2C shows the semiconductor wafer 200 after body and source implantations. The body and source implantations define a body region 106 of the second conductivity type and a source region 104 of the first conductivity type in each transistor cell TC, respectively.

FIG. 2D shows the semiconductor wafer 200 after etching a field plate trench 130 into the first main surface 202 of the wafer 200. The field plate trench 130 extends through the semiconductor mesa 114 and has at least one sidewall 134 and a bottom 136. For example, in the case of a needle-shape, the field plate trench 130 has a single curved sidewall 134 that defines the trench perimeter. In the case of a stripe-shape, the field plate trench 130 has two sidewalls 134 that oppose one another and that define the trench perimeter.

Figure 2F:
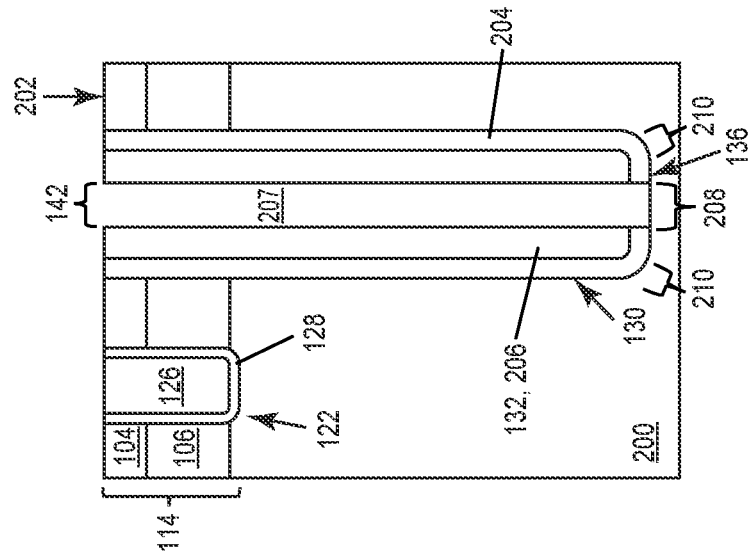
Figure 2E:
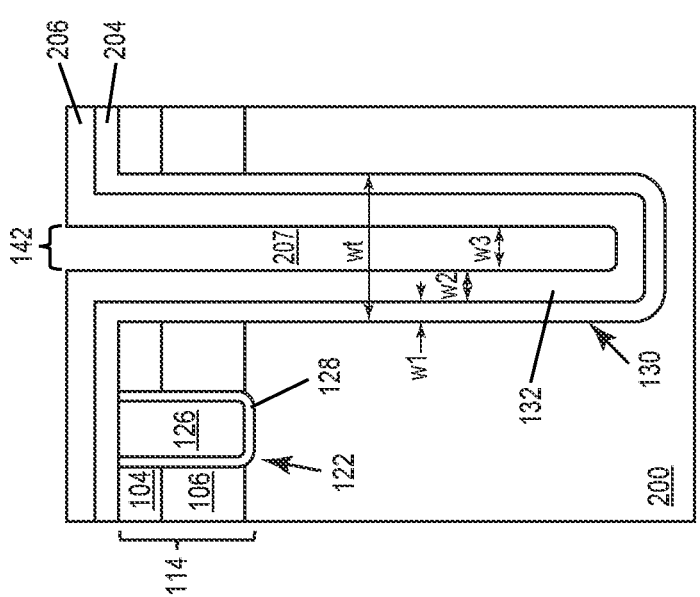

FIG. 2E shows the semiconductor wafer 200 after lining each sidewall 134 and the bottom 136 of the field plate trench 130 with an oxide 204 and forming polysilicon 206 on the oxide 204. In one embodiment, the oxide 204 is a field oxide. The polysilicon 206 forms the field plate 132 and is deposited without closing the space 207 in a central part 142 of the field plate 132. Deposition of the polysilicon 206 can be carefully controlled so the central part 142 of the field plate 132 remains open/unfilled for the subsequently formed anchor structure. For example, the deposition rate (Angstroms/time unit) of the polysilicon 206 can be carefully controlled. Polysilicon tends to 'grow' conformally but faster at the trench top than the trench bottom so the trench top tends to seal off first, leaving a skinny seam in the middle.

The trench sidewalls 134 may be slightly sloped, e.g., 88 or 89 degrees relative to normal, to ensure the polysilicon 206 is deposited without closing the space 207 in the central part 142 of the field plate 132. Alternatively, the field plate trench 130 may be filled with the polysilicon 206 which is then removed from the center of the field plate trench 130 by masking and anisotropic etching. Instead of polysilicon, the field plate 132 may be made of a metal or metal alloy such as W (tungsten) with a Ti/TiN liner. In one embodiment, the lateral width w1 of the oxide 204, the lateral width w2 of the polysilicon 206, and the lateral width w1 of the space 207 are each ⅕ of the lateral width wt of the field plate trench 130 such that 2*w1+2*w2+w3=wt where w3 may be 2*w1 or 2*w2. Still other relationships may be employed for w1, w2 and w3 relative to wt.

FIG. 2F shows the semiconductor wafer 200 after removing the polysilicon 206 and the oxide 204 from the first main surface 202 of the semiconductor wafer 200 and from a central part 208 of the bottom 136 of the field plate trench 130 such that a corner part 210 of the bottom 136 of the field plate trench 130 remains covered by both the oxide 204 and the polysilicon 206. In one embodiment, the polysilicon 206 and the oxide 204 are removed from the central part 208 of the bottom 136 of the field plate trench 130 but not from the corner part 210 of the bottom 136 of the field plate trench 130 by anisotropically etching the polysilicon 206 and the oxide 204 at the central part 208 of the bottom 136 of the field plate trench 130.

Figure 2H:
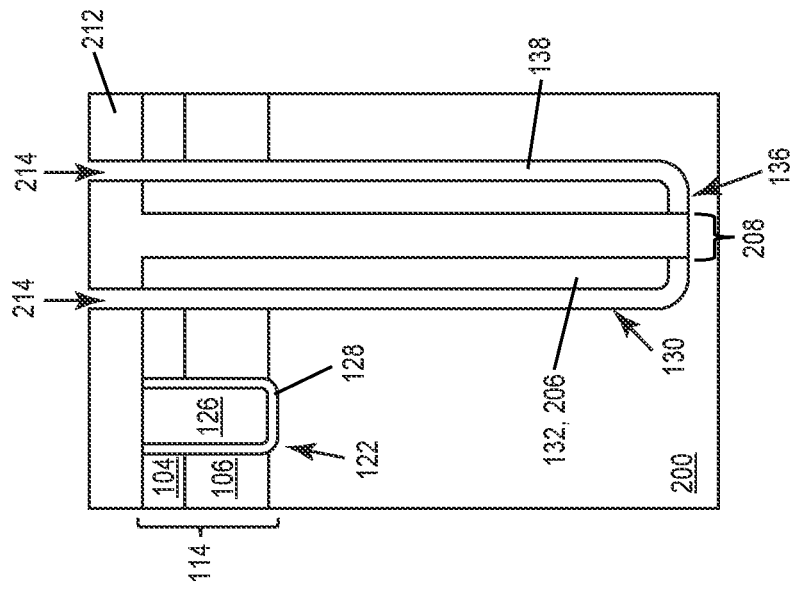
Figure 2G:
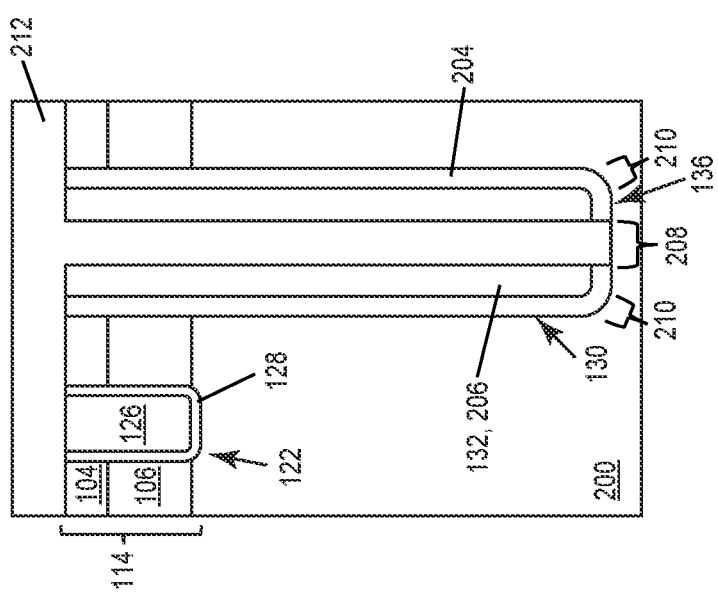

FIG. 2G shows the semiconductor wafer 200 after filling the space 207 in the central part 142 of the field plate 132 with nitride 212. Another dielectric material having a different etch selectivity than oxide may be used instead of the nitride 212.

FIG. 2H shows the semiconductor wafer 200 after filling removing the oxide 204 from each sidewall 134 and the corner part 210 of the bottom 136 of the field plate trench 130. In one embodiment, openings 214 are formed in the nitride 212 and that expose the oxide 204. A liquid etchant is then placed in the openings 214 to remove the oxide 204 selective to the nitride 212 so that the nitride 212 remains. The liquid etchant has good selectivity to the nitride 212, e.g., 1:100 such that the nitride 212 is not attacked by the etchant. After removing the oxide 204 from the field plate trench 130, the field plate 132 is separated from each sidewall 134 and the bottom 136 of the field plate trench 130 by an air gap 138. The air gap 138 may be at a partial vacuum and/or filled with an inert gas, as described herein.

Figure 2J:
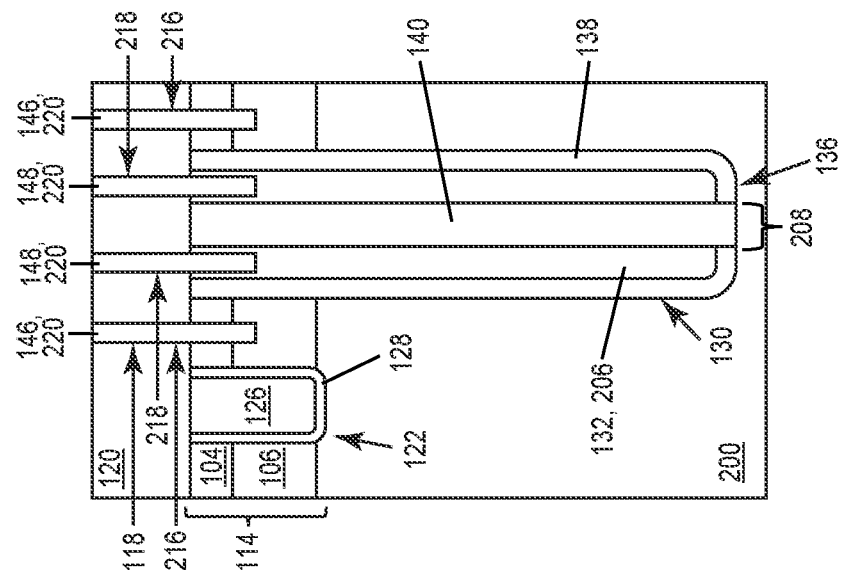
Figure 2I:
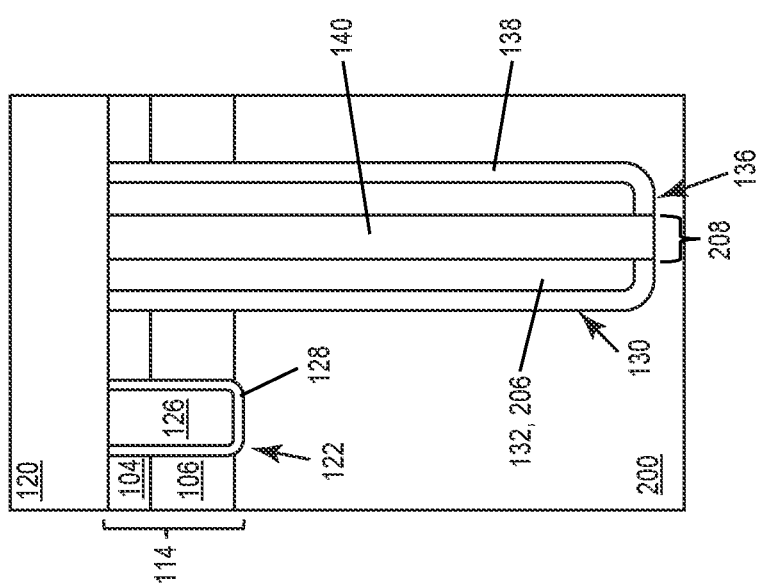

FIG. 2I shows the semiconductor wafer 200 after filling removing the nitride 212 from the first main surface 202 of the semiconductor wafer 200 to form the electrically insulative anchoring material 140 and after forming an interlayer dielectric 120 on the first main surface 202 of the semiconductor wafer 200. The interlayer dielectric 120 seals the air gap 138 in the field plate trench 130. The electrically insulative material 140 occupies the space 207 in the central part 142 of the field plate 132 and anchors the field plate 132 to the semiconductor wafer 200 at the bottom 136 of the field plate trench 130. The electrically insulative material 140 spans the air gap 138 to contact the semiconductor wafer 200 at the bottom of the field plate trench 130.

FIG. 2J shows the semiconductor wafer 200 after forming the contact structure 118 that extends through the interlayer dielectric 120. In one embodiment, the contact structure 118 is realized by forming, in the interlayer dielectric 120, one or more first openings 216 aligned with the semiconductor mesa 114 and one more second openings 218 aligned with the field plate 132. The openings 216, 218 in the interlayer dielectric 120 may be formed by masking and anisotropic etching, for example. An electrically conductive material 220 such as tungsten is deposited in each first opening 216 and each second opening 218 formed in the interlayer dielectric 120 to form first contacts 146 to the source and body regions 104, 106 and second contacts 148 to the field plate 132 in the field plate trench 130.

Figure 2K:
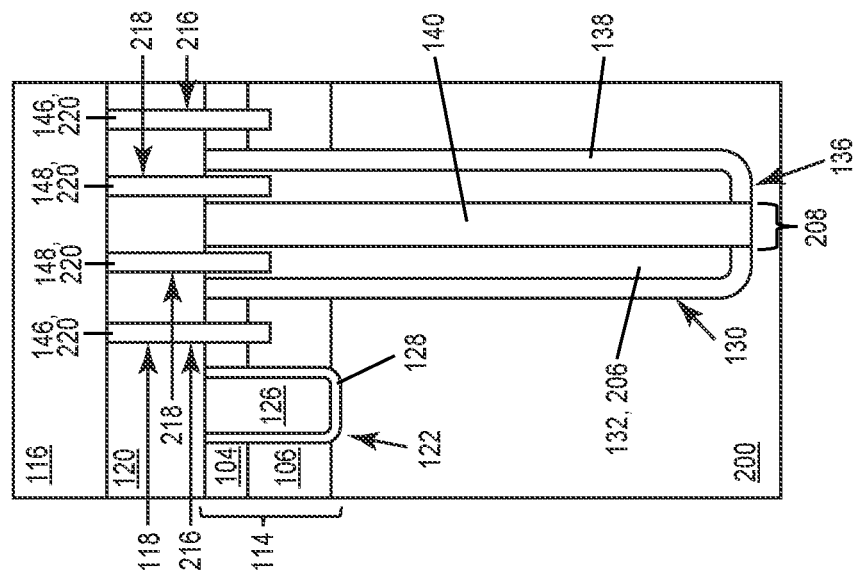

FIG. 2K shows the semiconductor wafer 200 after forming a metallization layer 116 such as Al, AlCu, Cu, etc. on the interlayer dielectric 120. The first contacts 146 of the contact structure 118 extend through the interlayer dielectric 120 to electrically connect the metallization layer 116 to the source and body regions 104, 106 formed in the semiconductor mesa 114. The second contacts 148 of the contact structure 118 extend through the interlayer dielectric 120 to electrically connect the metallization layer 116 to the field plate 132 in the field plate trench 130.

FIGS. 3A through 8B illustrate additional semiconductor device embodiments that include the field plate anchoring structure. FIGS. 3A, 4A, 5A, 6A, 7A, and 8A are cross-sectional views in the region of one transistor cell TC, whereas FIGS. 3B, 4B, 5B, 6B, 7B, and 8B are corresponding top plan views in the region of two or more adjacent transistor cells TC.

According to the embodiment illustrated in FIGS. 3A and 3B, the gate trenches 122 are stripe-shaped in a lengthwise direction (both x and y directions in FIG. 3B) of the gate trenches 122 and the field plate trenches 130 are needle-shaped in a lengthwise direction (z direction in FIG. 3A) of the field plate trenches 130. The lengthwise direction of the gate trenches 122 is parallel to the first main surface 124 of the semiconductor substrate 102. The lengthwise direction of the field plate trenches 130 is perpendicular to the first main surface 124 of the semiconductor substrate 102. Separately or in combination, the second part 148 of the contact structure 118 has an opening 300 that is aligned with the electrically insulative anchoring material 140 that occupies the space in the central part 142 of the field plates 132.

Figures 4A, 4B:
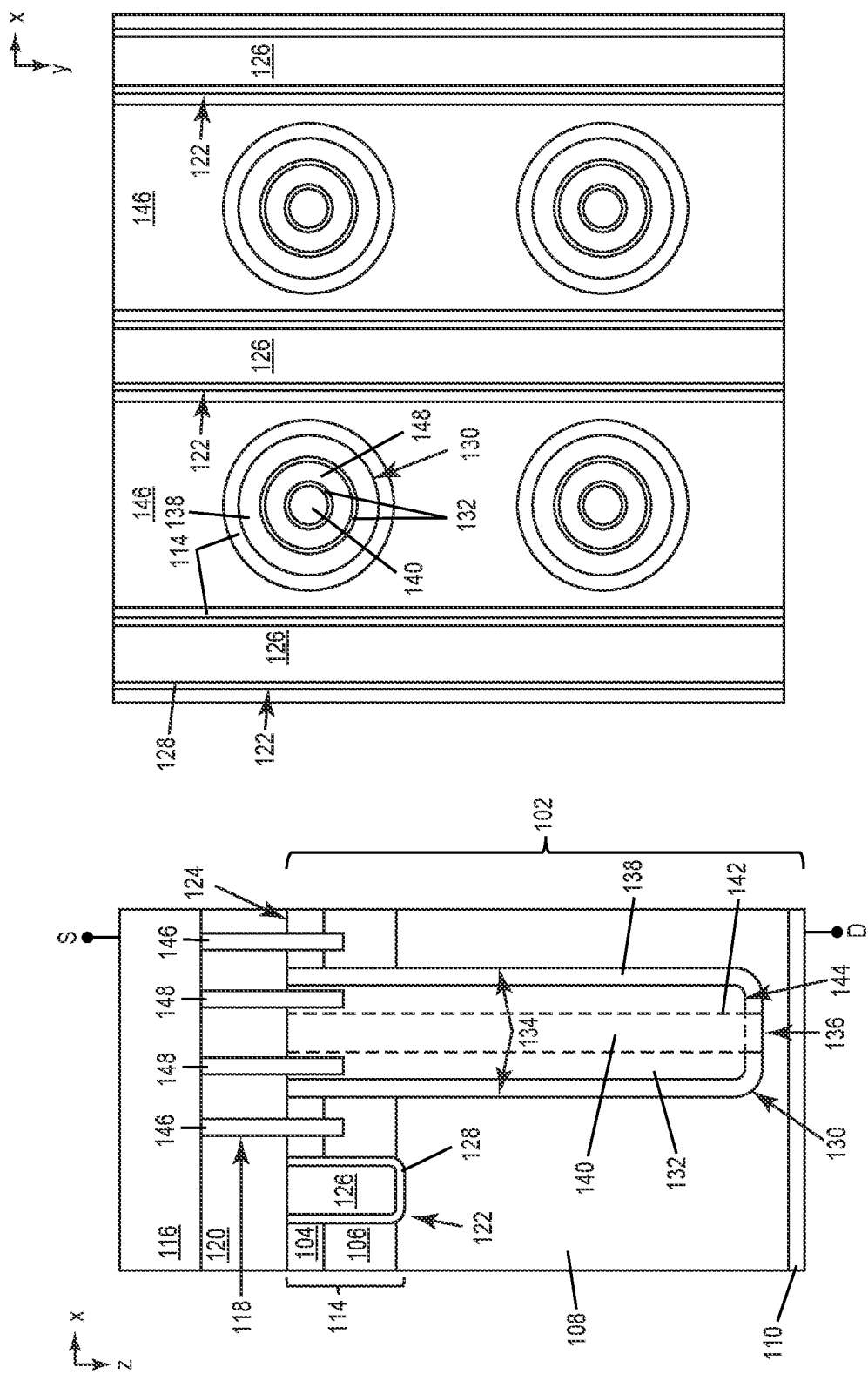

The embodiment illustrated in FIGS. 4A and 4B is similar to the embodiment illustrated in FIGS. 3A and 3B. Differently, however, the gate trenches 122 are stripe-shaped in a lengthwise direction (y direction in FIG. 3B) of the field plate trenches 130.

The embodiment illustrated in FIGS. 5A and 5B is similar to the embodiment illustrated in FIGS. 3A and 3B. Differently, however, the electrically insulative anchoring material 140 that occupies the space in the central part 142 of the field plates 132 is recessed below the first main surface 124 of the semiconductor substrate 102 and the second part 148 of the contact structure 118 occupies the recess in the electrically insulative anchoring material 140. The inner part of the field plate electrodes 132 also may be recessed below the first main surface 124 of the semiconductor substrate 102 and the second part 148 of the contact structure 118 may occupy the recess in the field plates 132. According to the embodiments illustrated in FIGS. 5A-5B and FIGS. 3A-3B, the first part 146 of the contact structure 118 may have a square cross-section in a direction (x or y direction in FIGS. 3A and 5A) parallel to the first main surface 124 of the semiconductor substrate 102 and the second part 148 of the contact structure 118 may have a circular cross-section in the same direction.

The embodiment illustrated in FIGS. 6A and 6B is similar to the embodiment illustrated in FIGS. 4A and 4B. Differently, however, the electrically insulative anchoring material 140 that occupies the space in the central part 142 of the field plates 132 is recessed below the first main surface 124 of the semiconductor substrate 102 and the second part 148 of the contact structure 118 occupies the recess in the electrically insulative anchoring material 140. The inner part of the field plate electrodes 132 also may be recessed below the first main surface 124 of the semiconductor substrate 102 and the second part 148 of the contact structure 118 may occupy the recess in the field plates 132. According to the embodiments illustrated in FIGS. 6A-6B and FIGS. 4A-4B, the first part 146 of the contact structure 118 may have a rectangular cross-section in a direction (y direction in FIGS. 4A and 6A) parallel to the first main surface 124 of the semiconductor substrate 102 and the second part 148 of the contact structure 118 may have a circular cross-section in the same direction.

The embodiment illustrated in FIGS. 7A and 7B is similar to the embodiment illustrated in FIGS. 3A and 3B. Differently, however, both the gate trenches 122 and the field plate trenches 130 are stripe-shaped in the same lengthwise direction (y direction in FIG. 7B) where the lengthwise direction of both types of trenches 122, 130 is parallel to the first main surface 124 of the semiconductor substrate 102.

The embodiment illustrated in FIGS. 8A and 8B is similar to the embodiment illustrated in FIGS. 7A and 7B. Differently, however, the electrically insulative anchoring material 140 that occupies the space in the central part 142 of the field plates 132 is recessed below the first main surface 124 of the semiconductor substrate 102 and the second part 148 of the contact structure 118 occupies the recess in the electrically insulative anchoring material 140. The inner part of the field plate electrodes 132 also may be recessed below the first main surface 124 of the semiconductor substrate 102 and the second part 148 of the contact structure 118 may occupy the recess in the field plates 132. According to the embodiments illustrated in FIGS. 8A-8B and FIGS. 7A-7B, the first part 146 of the contact structure 118 may have a rectangular cross-section in a direction (y direction in FIG. 7B and FIG. 8B) parallel to the first main surface 124 of the semiconductor substrate 102 and the second part 148 of the contact structure 118 also may have a rectangular cross-section in the same direction.

Although the present disclosure is not so limited, the following numbered examples demonstrate one or more aspects of the disclosure.

Example 1. A semiconductor device, comprising: a semiconductor substrate; a first gate trench and a second gate trench both extending from a first main surface of the semiconductor substrate into the semiconductor substrate; a semiconductor mesa delimited by the first and second gate trenches; and a field plate trench extending from the first main surface through the semiconductor mesa, wherein the field plate trench comprises a field plate separated from each sidewall and a bottom of the field plate trench by an air gap, wherein the field plate is anchored to the semiconductor substrate at the bottom of the field plate trench by an electrically insulative material that occupies a space in a central part of the field plate, the electrically insulative material spanning the air gap to contact the semiconductor substrate at the bottom of the field plate trench.

Example 2. The semiconductor device of example 1, wherein the field plate comprises polysilicon, and wherein the electrically insulative material comprises nitride.

Example 3. The semiconductor device of example 1 or 2, wherein the first and second gate trenches are stripe-shaped in a lengthwise direction of the first and second gate trenches, wherein the field plate trench is needle-shaped in a lengthwise direction of the field plate trench, wherein the lengthwise direction of the first and second gate trenches is parallel to the first main surface of the semiconductor substrate, and wherein the lengthwise direction of the field plate trench is perpendicular to the first main surface of the semiconductor substrate.

Example 4. The semiconductor device of any of examples 1 through 3, further comprising: a contact structure having a first part in electrical and physical contact with one or more device regions formed in the semiconductor mesa, and a second part in electrical and physical contact with the field plate, wherein the second part of the contact structure is laterally spaced inward and separated from the first part of the contact structure.

Example 5. The semiconductor device of example 4, wherein the space between the second part of the contact structure and the first part of the contact structure is aligned with the air gap in the field plate trench such that no part of the contact structure covers the air gap.

Example 6. The semiconductor device of example 4 or 5, wherein the second part of the contact structure has an opening aligned with the electrically insulative material that occupies the space in the central part of the field plate.

Example 7. The semiconductor device of any of examples 4 through 6, wherein the electrically insulative material that occupies the space in the central part of the field plate is recessed below the first main surface of the semiconductor substrate, and wherein the second part of the contact structure occupies the recess in the electrically insulative material.

Example 8. The semiconductor device of any of examples 4 through 7, wherein the first part of the contact structure has a square cross-section in a direction parallel to the first main surface of the semiconductor substrate, and wherein the second part of the contact structure has a circular cross-section in the same direction.

Example 9. The semiconductor device of any of examples 4 through 7, wherein the first part of the contact structure has a rectangular cross-section in a direction parallel to the first main surface of the semiconductor substrate, and wherein the second part of the contact structure has a circular cross-section in the same direction.

Example 10. The semiconductor device of any of examples 4 through 7, wherein the first part of the contact structure has a rectangular cross-section in a direction parallel to the first main surface of the semiconductor substrate, and wherein the second part of the contact structure has a rectangular cross-section in the same direction.

Example 11. The semiconductor device of any of examples 4 through 10, further comprising: an interlayer dielectric on the first main surface of the semiconductor substrate and sealing the air gap in the field plate trench; and a metallization layer on the interlayer dielectric, wherein the first part of the contact structure extends through the interlayer dielectric to electrically connect the metallization layer to the one or more device regions formed in the semiconductor mesa, wherein the second part of the contact structure extends through the interlayer dielectric to electrically connect the metallization layer to the field plate in the field plate trench.

Example 12. A semiconductor device, comprising: a semiconductor substrate; a gate trench extending from a first main surface of the semiconductor substrate into the semiconductor substrate; a field plate trench extending from the first main surface into the semiconductor substrate and laterally spaced apart from the gate trench, the field plate trench having one or more sidewalls and a bottom; a field plate in the field plate trench; an air gap separating the field plate from the one or more sidewalls and the bottom of the field plate trench; a space in a central part of the field plate; and an electrically insulative material occupying the space in the central part of the field plate and anchoring the field plate to the semiconductor substrate by spanning the air gap at the bottom of the field plate trench.

Example 13. A method of producing a semiconductor device, the method comprising: etching a first gate trench and a second gate trench into a first main surface of a semiconductor substrate, the first and second gate trenches delimiting a semiconductor mesa; etching a field plate trench into the first main surface, the field plate trench extending through the semiconductor mesa; forming a field plate in the field plate trench, the field plate being separated from each sidewall and a bottom of the field plate trench by an air gap, the field plate having a space in a central part of the field plate; and anchoring the field plate to the semiconductor substrate at the bottom of the field plate trench by an electrically insulative material that occupies the space in the central part of the field plate, the electrically insulative material spanning the air gap to contact the semiconductor substrate at the bottom of the field plate trench.

Example 14. The method of example 13, wherein forming the field plate comprises: lining each sidewall and the bottom of the field plate trench with an oxide; forming polysilicon on the oxide without closing the space in the central part of the field plate; and removing the polysilicon and the oxide from a central part of the bottom of the field plate trench such that a corner part of the bottom of the field plate trench remains covered by both the oxide and the polysilicon.

Example 15. The method of example 14, wherein removing the polysilicon and the oxide from the central part of the bottom of the field plate trench comprises: anisotropically etching the polysilicon and the oxide at the central part of the bottom of the field plate trench.

Example 16. The method of example 14 or 15, wherein anchoring the field plate to the semiconductor substrate at the bottom of the field plate trench comprises: after removing the polysilicon and the oxide from the central part of the bottom of the field plate trench, filling the space in the central part of the field plate with nitride; and after filling the space in the central part of the field plate with the nitride, removing the oxide from each sidewall and the corner part of the bottom of the field plate trench.

Example 17. The method of any of examples 13 through 16, further comprising: forming a contact structure having a first part in electrical and physical contact with one or more device regions formed in the semiconductor mesa, and a second part in electrical and physical contact with the field plate, wherein the second part of the contact structure is laterally spaced inward and separated from the first part of the contact structure.

Example 18. The method of example 17, wherein forming the contact structure comprises: forming an interlayer dielectric on the first main surface of the semiconductor substrate, the interlayer dielectric sealing the air gap in the field plate trench; forming, in the interlayer dielectric, one or more first openings aligned with the semiconductor mesa and one more second openings aligned with the field plate; and depositing an electrically conductive material in each first opening and each second opening formed in the interlayer dielectric.

Example 19. The method of example 18, further comprising: recessing the electrically insulative material that occupies the space in the central part of the field plate below the first main surface of the semiconductor substrate, wherein after depositing the electrically conductive material, the second part of the contact structure occupies the recess in the electrically insulative material.

Example 20. The method of example 18 or 19, further comprising: forming a metallization layer on the interlayer dielectric, wherein the first part of the contact structure extends through the interlayer dielectric to electrically connect the metallization layer to the one or more device regions formed in the semiconductor mesa, wherein the second part of the contact structure extends through the interlayer dielectric to electrically connect the metallization layer to the field plate in the field plate trench.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate;
a first gate trench and a second gate trench both extending from a first main surface of the semiconductor substrate into the semiconductor substrate;
a semiconductor mesa delimited by the first and second gate trenches; and
a field plate trench extending from the first main surface through the semiconductor mesa,
wherein the field plate trench comprises a field plate separated from each sidewall and a bottom of the field plate trench by an air gap,
wherein the field plate is anchored to the semiconductor substrate at the bottom of the field plate trench by an electrically insulative material that occupies a space in a central part of the field plate, the electrically insulative material spanning the air gap to contact the semiconductor substrate at the bottom of the field plate trench.

2. The semiconductor device of claim 1, wherein the field plate comprises polysilicon, and wherein the electrically insulative material comprises nitride.

3. The semiconductor device of claim 1, wherein the first and second gate trenches are stripe-shaped in a lengthwise direction of the first and second gate trenches, wherein the field plate trench is needle-shaped in a lengthwise direction of the field plate trench, wherein the lengthwise direction of the first and second gate trenches is parallel to the first main surface of the semiconductor substrate, and wherein the lengthwise direction of the field plate trench is perpendicular to the first main surface of the semiconductor substrate.

4. The semiconductor device of claim 1, further comprising:
a contact structure having a first part in electrical and physical contact with one or more device regions formed in the semiconductor mesa, and a second part in electrical and physical contact with the field plate,
wherein the second part of the contact structure is laterally spaced inward and separated from the first part of the contact structure.

5. The semiconductor device of claim 4, wherein the space between the second part of the contact structure and the first part of the contact structure is aligned with the air gap in the field plate trench such that no part of the contact structure covers the air gap.

6. The semiconductor device of claim 4, wherein the second part of the contact structure has an opening aligned with the electrically insulative material that occupies the space in the central part of the field plate.

7. The semiconductor device of claim 4, wherein the electrically insulative material that occupies the space in the central part of the field plate is recessed below the first main surface of the semiconductor substrate such that the electrically insulative material has a recess, and wherein the second part of the contact structure occupies the recess in the electrically insulative material.

8. The semiconductor device of claim 4, wherein the first part of the contact structure has a square cross-section in a direction parallel to the first main surface of the semiconductor substrate, and wherein the second part of the contact structure has a circular cross-section in the same direction.

9. The semiconductor device of claim 4, wherein the first part of the contact structure has a rectangular cross-section in a direction parallel to the first main surface of the semiconductor substrate, and wherein the second part of the contact structure has a circular cross-section in the same direction.

10. The semiconductor device of claim 4, wherein the first part of the contact structure has a rectangular cross-section in a direction parallel to the first main surface of the semiconductor substrate, and wherein the second part of the contact structure has a rectangular cross-section in the same direction.

11. The semiconductor device of claim 4, further comprising:
an interlayer dielectric on the first main surface of the semiconductor substrate and sealing the air gap in the field plate trench; and
a metallization layer on the interlayer dielectric,
wherein the first part of the contact structure extends through the interlayer dielectric to electrically connect the metallization layer to the one or more device regions formed in the semiconductor mesa,
wherein the second part of the contact structure extends through the interlayer dielectric to electrically connect the metallization layer to the field plate in the field plate trench.

12. A semiconductor device, comprising:
a semiconductor substrate;
a gate trench extending from a first main surface of the semiconductor substrate into the semiconductor substrate;
a field plate trench extending from the first main surface into the semiconductor substrate and laterally spaced apart from the gate trench, the field plate trench having one or more sidewalls and a bottom;

a field plate in the field plate trench;

an air gap separating the field plate from the one or more sidewalls and the bottom of the field plate trench;

a space in a central part of the field plate; and an electrically insulative material occupying the space in the central part of the field plate and anchoring the field plate to the semiconductor substrate by spanning the air gap at the bottom of the field plate trench.

13. A method of producing a semiconductor device, the method comprising:

etching a first gate trench and a second gate trench into a first main surface of a semiconductor substrate, the first and second gate trenches delimiting a semiconductor mesa;

etching a field plate trench into the first main surface, the field plate trench extending through the semiconductor mesa;

forming a field plate in the field plate trench, the field plate being separated from each sidewall and a bottom of the field plate trench by an air gap, the field plate having a space in a central part of the field plate; and anchoring the field plate to the semiconductor substrate at the bottom of the field plate trench by an electrically insulative material that occupies the space in the central part of the field plate, the electrically insulative material spanning the air gap to contact the semiconductor substrate at the bottom of the field plate trench.

14. The method of claim 13, wherein forming the field plate comprises:

lining each sidewall and the bottom of the field plate trench with an oxide;

forming polysilicon on the oxide without closing the space in the central part of the field plate; and removing the polysilicon and the oxide from a central part of the bottom of the field plate trench such that a corner part of the bottom of the field plate trench remains covered by both the oxide and the polysilicon.

15. The method of claim 14, wherein removing the polysilicon and the oxide from the central part of the bottom of the field plate trench comprises:

anisotropically etching the polysilicon and the oxide at the central part of the bottom of the field plate trench.

16. The method of claim 14, wherein anchoring the field plate to the semiconductor substrate at the bottom of the field plate trench comprises:

after removing the polysilicon and the oxide from the central part of the bottom of the field plate trench, filling the space in the central part of the field plate with nitride; and after filling the space in the central part of the field plate with the nitride, removing the oxide from each sidewall and the corner part of the bottom of the field plate trench.

17. The method of claim 13, further comprising:

forming a contact structure having a first part in electrical and physical contact with one or more device regions formed in the semiconductor mesa, and a second part in electrical and physical contact with the field plate, wherein the second part of the contact structure is laterally spaced inward and separated from the first part of the contact structure.

18. The method of claim 17, wherein forming the contact structure comprises:

forming an interlayer dielectric on the first main surface of the semiconductor substrate, the interlayer dielectric sealing the air gap in the field plate trench;

forming, in the interlayer dielectric, one or more first openings aligned with the semiconductor mesa and one more second openings aligned with the field plate; and depositing an electrically conductive material in each first opening and each second opening formed in the interlayer dielectric.

19. The method of claim 18, further comprising:

recessing the electrically insulative material that occupies the space in the central part of the field plate below the first main surface of the semiconductor substrate, wherein after depositing the electrically conductive material, the second part of the contact structure occupies the recess in the electrically insulative material.

20. The method of claim 18, further comprising:

forming a metallization layer on the interlayer dielectric, wherein the first part of the contact structure extends through the interlayer dielectric to electrically connect the metallization layer to the one or more device regions formed in the semiconductor mesa, wherein the second part of the contact structure extends through the interlayer dielectric to electrically connect the metallization layer to the field plate in the field plate trench.

* * * * *